(12) United States Patent
Chang et al.

(10) Patent No.: US 12,249,647 B2
(45) Date of Patent: Mar. 11, 2025

(54) POWER DEVICE AND FABRICATION METHOD THEREOF

(71) Applicant: UNITED MICROELECTRONICS CORP., Hsin-Chu (TW)

(72) Inventors: Chih-Chien Chang, Hsinchu (TW); Shen-De Wang, Hsinchu County (TW); Cheng-Hua Yang, Hsinchu (TW); Linggang Fang, Singapore (SG); Jianjun Yang, Singapore (SG); Wei Ta, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 483 days.

(21) Appl. No.: 17/702,831

(22) Filed: Mar. 24, 2022

(65) Prior Publication Data
US 2023/0268437 A1  Aug. 24, 2023

(30) Foreign Application Priority Data
Feb. 18, 2022 (CN) .......................... 202210149475.1

(51) Int. Cl.
H01L 29/78 (2006.01)
H01L 27/088 (2006.01)
H01L 29/423 (2006.01)
H01L 29/66 (2006.01)
H01L 29/788 (2006.01)

(52) U.S. Cl.
CPC ........ H01L 29/7816 (2013.01); H01L 27/088 (2013.01); H01L 29/42328 (2013.01); H01L 29/66484 (2013.01); H01L 29/6656 (2013.01); H01L 29/66689 (2013.01); H01L 29/66825 (2013.01); H01L 29/788 (2013.01); H01L 29/42324 (2013.01); H01L 29/42344 (2013.01)

(58) Field of Classification Search
CPC ............... H01L 29/7816; H01L 27/088; H01L 29/42328; H01L 29/66484; H01L 29/6656; H01L 29/66689; H01L 29/66825; H01L 29/788; H01L 29/404; H01L 29/42368; H01L 29/66659; H01L 29/1045; H01L 29/7835; H01L 29/42324; H01L 21/823456; H01L 29/42344; H01L 29/7831
See application file for complete search history.

(56) References Cited

U.S. PATENT DOCUMENTS 6,747,310 B2 * 6/2004 Fan ................... H01L 29/42328
  257/E27.103
6,885,044 B2 * 4/2005 Ding ................... H01L 29/7923
  438/587

(Continued)

FOREIGN PATENT DOCUMENTS

TW  201203466 A  *  1/2012  ........ H01L 27/11521

Primary Examiner — Maliheh Malek
(74) Attorney, Agent, or Firm — Winston Hsu

(57) ABSTRACT

A power device includes a substrate, an ion well in the substrate, a body region in the ion well, a source doped region in the body region, a drain doped region in the ion well, and gates on the substrate between the source doped region and the drain doped region. The gates include a first gate adjacent to the source doped region, a second gate adjacent to the drain doped region, and a stacked gate structure between the first gate and the second gate.

17 Claims, 4 Drawing Sheets

(56) References Cited

U.S. PATENT DOCUMENTS

| | | | | |
|---|---|---|---|---|
| 6,902,974 B2* | 6/2005 | Ding | H10B 41/49 | 438/257 |
| 6,974,739 B2* | 12/2005 | Ding | H01L 21/76802 | 257/E21.59 |
| 7,053,438 B2* | 5/2006 | Ding | H10B 41/49 | 438/257 |
| 7,718,488 B2* | 5/2010 | Chen | G11C 16/0425 | 438/257 |
| 8,669,607 B1* | 3/2014 | Tsair | H10B 41/00 | 438/257 |
| 9,842,844 B2* | 12/2017 | Wu | H01L 29/42324 | |
| 9,859,415 B2* | 1/2018 | Toh | H01L 28/00 | |
| 10,103,156 B2* | 10/2018 | Cai | H10B 43/00 | |
| 10,192,874 B2* | 1/2019 | Yi | H10B 41/35 | |
| 10,608,090 B2* | 3/2020 | Yang | H01L 29/0847 | |
| 10,762,966 B2* | 9/2020 | Cai | H10B 41/30 | |
| 10,790,292 B2* | 9/2020 | Kim | H01L 29/40114 | |
| 10,902,921 B2* | 1/2021 | Bo | G11C 16/30 | |
| 10,937,794 B2* | 3/2021 | Zhou | H01L 29/66537 | |
| 11,315,635 B2* | 4/2022 | Wang | H10B 41/30 | |
| 11,316,024 B2* | 4/2022 | Wang | H01L 29/66825 | |
| 11,322,507 B2* | 5/2022 | Wang | H01L 21/28052 | |
| 11,545,583 B2* | 1/2023 | Chen | H01L 29/4933 | |
| 11,737,266 B2* | 8/2023 | Song | H01L 21/823456 | 438/258 |
| 2005/0207225 A1* | 9/2005 | Chen | H10B 41/35 | 257/E27.103 |
| 2011/0110156 A1* | 5/2011 | Kawashima | H10B 43/40 | 257/E29.345 |
| 2012/0228704 A1* | 9/2012 | Ju | H01L 29/66689 | 257/E29.256 |
| 2012/0299084 A1* | 11/2012 | Saito | H01L 29/66833 | 257/E21.409 |
| 2013/0181286 A1* | 7/2013 | Zhang | H01L 29/665 | 257/E29.256 |
| 2013/0223148 A1* | 8/2013 | Seo | H01L 29/42328 | 365/185.11 |
| 2013/0320432 A1* | 12/2013 | Ng | H01L 21/82385 | 257/E27.06 |
| 2015/0054044 A1* | 2/2015 | Perera | H01L 29/7881 | 257/314 |
| 2016/0020219 A1* | 1/2016 | Chuang | H01L 29/78 | 438/151 |
| 2016/0056250 A1* | 2/2016 | Chuang | H01L 29/42344 | 257/326 |
| 2017/0084736 A1* | 3/2017 | Toh | H01L 29/7831 | |
| 2017/0103991 A1* | 4/2017 | Kim | H10B 41/49 | |
| 2018/0233509 A1* | 8/2018 | Cai | G11C 16/0491 | |
| 2019/0067305 A1* | 2/2019 | Shih | H01L 29/42328 | |
| 2020/0075614 A1* | 3/2020 | Huang | H10B 43/23 | |
| 2022/0254920 A1* | 8/2022 | Chen | H01L 29/788 | |

* cited by examiner

POWER DEVICE AND FABRICATION METHOD THEREOF

BACKGROUND OF THE INVENTION

1. Field of the Invention

The present invention relates to the field of semiconductor technology, and in particular, to a semiconductor power device and a manufacturing method thereof.

2. Description of the Prior Art

Power metal oxide semiconductor field effect transistors (MOSFETs) are commonly used power devices due to their low gate drive power, fast switching speed and superior paralleling capability.

Power MOS has larger poly width for E-filed modulation to gain higher device breakdown voltage (BVD), but it gets higher gate-to-drain capacitance (Cgd) and results in higher power loss during high frequency switching operation.

One way to reduce Cgd is to divide the polysilicon gate into smaller gate and field gate and connect the field gate to the source doped region or another terminal. However, the disadvantage of the above method is that the size of the device becomes larger, and the on-resistance (RON) of the device is also higher, so there is still the problem of power loss.

SUMMARY OF THE INVENTION

One object of the present invention is to provide a power device and a manufacturing method thereof in order to solve the above-mentioned deficiencies or shortcomings of the prior art.

One aspect of the present invention provides a power device including a substrate of a first conductivity type, an ion well of the first conductivity type in the substrate, a body region of the first conductivity type in the ion well, a source doped region of the second conductivity in the body region, a drain doped region of the second conductivity in the ion well, and gates disposed on the substrate between the source doped region and the drain doped region. The gates extend in parallel with one another along a first direction. The gates comprise a first gate adjacent to the source doped region, a second gate adjacent to the drain doped region, and a stack gate structure between the first gate and the second gate.

According to some embodiments, the first conductivity type is P type and the second conductivity type is N type.

According to some embodiments, the ion well of the first conductivity type is a deep P well.

According to some embodiments, the power device further includes a deep N well in the substrate under the deep P well.

According to some embodiments, the stack gate structure is insulated from the first gate and the second gate.

According to some embodiments, the stack gate structure comprises a floating gate and a control gate stacked on the floating gate.

According to some embodiments, the floating gate protrudes from a bottom of the control gate in a second direction.

According to some embodiments, an oxide-nitride-oxide (ONO) layer is disposed between the floating gate and the control gate.

According to some embodiments, the gates are polysilicon gates.

According to some embodiments, the power device further includes a first gate contact electrically connected to the first gate, a second gate contact electrically connected to the second gate, a floating gate contact electrically connected to the floating gate, a source contact electrically connected to the source doped region, and a drain contact electrically connected to the drain doped region.

According to some embodiments, the power device further includes a drift region of a second conductivity in the ion well. The drift region is spaced apart from the body region. The first gate is located between the body region and the drift region.

Another aspect of the invention discloses a method for forming a power device. A substrate of a first conductivity type is provided. An ion well of the first conductivity type is formed in the substrate. A body region of the first conductivity type is formed in the ion well. A source doped region of the second conductivity is formed in the body region. A drain doped region of the second conductivity is formed in the ion well. Gates are formed on the substrate between the source doped region and the drain doped region. The gates extend in parallel with one another along a first direction. The gates comprise a first gate adjacent to the source doped region, a second gate adjacent to the drain doped region, and a stack gate structure between the first gate and the second gate.

According to some embodiments, the first conductivity type is P type and the second conductivity type is N type.

According to some embodiments, the ion well of the first conductivity type is a deep P well.

According to some embodiments, a deep N well is formed in the substrate under the deep P well.

According to some embodiments, the stack gate structure is insulated from the first gate and the second gate.

According to some embodiments, the stack gate structure comprises a floating gate and a control gate stacked on the floating gate.

According to some embodiments, the floating gate protrudes from a bottom of the control gate in a second direction.

According to some embodiments, an oxide-nitride-oxide (ONO) layer is disposed between the floating gate and the control gate.

According to some embodiments, the gates are polysilicon gates.

According to some embodiments, the method further comprises the steps of:
  forming a first gate contact electrically connected to the first gate;
  forming a second gate contact electrically connected to the second gate;
  forming a floating gate contact electrically connected to the floating gate;
  forming a source contact electrically connected to the source doped region; and
  forming a drain contact electrically connected to the drain doped region.

According to some embodiments, the method further comprises the step of: forming a drift region of a second conductivity in the ion well, wherein the drift region is spaced apart from the body region.

Still another aspect of the invention discloses a layout structure of a power device, including a substrate, a diffusion region in the substrate surrounded by a trench isolation region, a source doped region and a drain doped region in the diffusion region, and gates disposed on the substrate between the source doped region and the drain doped region.

The gates extend in parallel with one another and traverses across the diffusion region. The gates comprise a first gate adjacent to the source doped region, a second gate adjacent to the drain doped region, and a stack gate structure between the first gate and the second gate.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
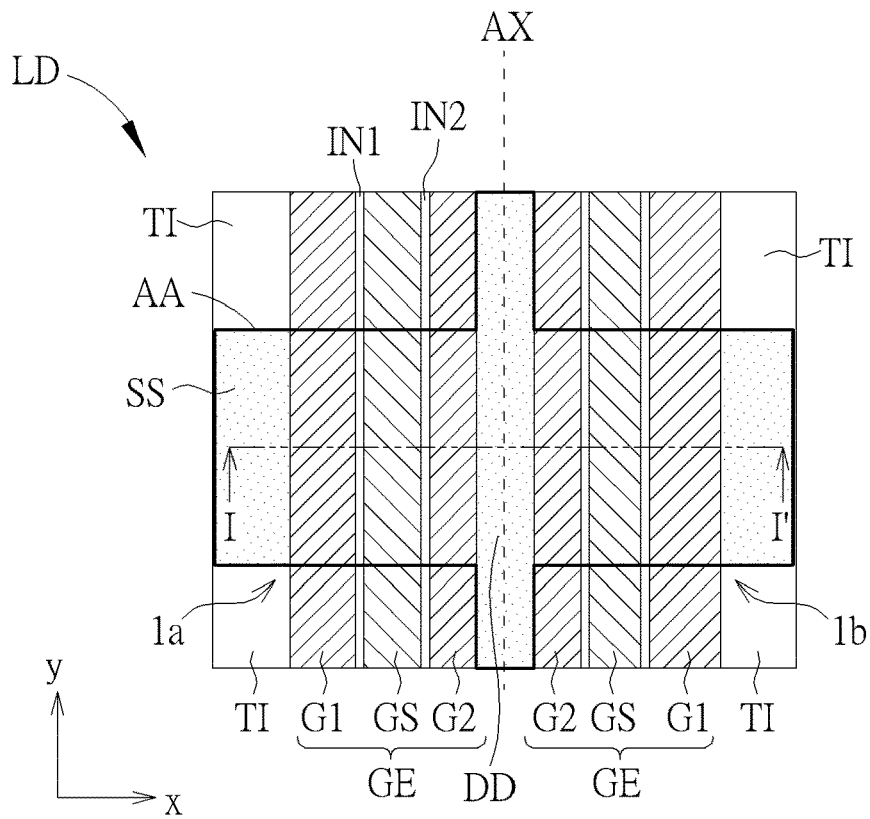
FIG. 1 is a schematic diagram of a layout structure of a power device according to an embodiment of the present invention.
Figure 2:
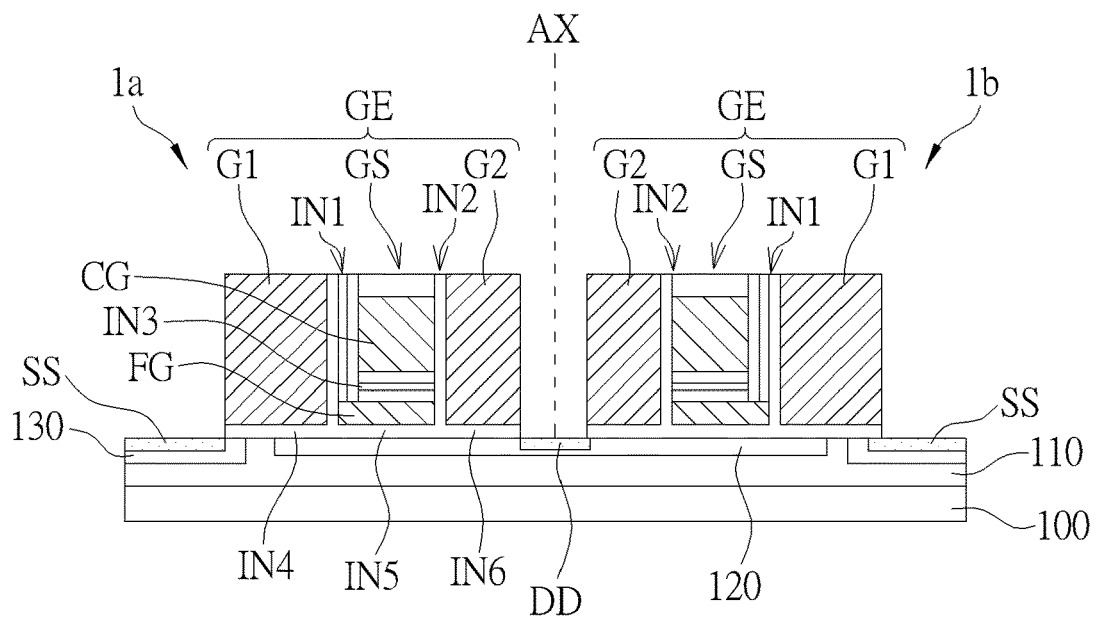
FIG. 2 is a schematic cross-sectional view of the power device taken along line I-I' in FIG. 1.

Please refer to FIG. 1 and FIG. 2. FIG. 1 is a schematic diagram of a layout structure of a power device according to an embodiment of the present invention. FIG. 2 is a cross-sectional view of the power device taken along line I-I' in FIG. 1. As shown in FIG. 1 and FIG. 2, the layout structure LD of the power device includes a substrate 100 of a first conductivity type. For example, the substrate 100 may be a semiconductor substrate such as a silicon substrate. According to the embodiment of the present invention, the substrate 100 may be a P-type doped silicon substrate, but is not limited thereto. According to an embodiment of the present invention, a diffusion area AA is formed in the substrate 100. The diffusion region AA extends along the reference x-axis direction and is surrounded by the trench isolation region TI.

According to an embodiment of the present invention, the layout structure LD in FIG. 1 and FIG. 2 includes two adjacent power devices 1a and 1b. According to the embodiment of the present invention, the power device 1a and the power device 1b exhibit mirror symmetry with each other with respect to the central axis AX. According to an embodiment of the present invention, the power device 1a and the power device 1b share a drain doped region DD of a second conductivity type extending along the reference y-axis direction, for example, an $N^+$ doped region.

According to an embodiment of the present invention, an ion well 110 of the first conductivity type, for example, a deep P-type well, is disposed in the diffusion area AA. In addition, a drift region 120 of the second conductivity type, for example, an N-type doped region, and a body region 130 of the first conductivity type, for example, a P-type body region, may be disposed in the ion well 110. According to an embodiment of the present invention, the drift region 120 is spaced apart from the body region 130. According to an embodiment of the present invention, the drain doped region DD is located within the drift region 120. According to some embodiments of the present invention, the drift region 120 of the second conductivity type may be omitted.

As shown in FIG. 1 and FIG. 2, the source doped regions SS of the power device 1a and the power device 1b are located in the body regions 130 of the diffusion region AA, respectively. Gates GE such as polysilicon gates are disposed on the substrate 100 between the source doped region SS and the drain doped region DD. According to an embodiment of the present invention, the gates GE includes a first gate G1 adjacent to the source doped region SS, a second gate G2 adjacent to the drain doped region DD, and a stacked gate structure GS between the first gate G1 and the second gate G2. According to an embodiment of the present invention, the first gate G1, the second gate G2 and the stacked gate structure GS extend parallel to each other along the reference y-axis direction and span the diffusion area AA.

According to an embodiment of the present invention, the first gate G1 is located between the body region 130 and the drift region 120. The stacked gate structure GS and the second gate G2 are located above the drift region 120. According to an embodiment of the present invention, an insulating layer IN1, for example, a silicon oxide layer or a silicon nitride layer, is disposed between the first gate G1 and the stacked gate structure GS, and an insulating layer IN2, for example, a silicon oxide layer or a silicon nitride layer, is disposed between the second gate G2 and the stacked gate structure GS.

According to an embodiment of the present invention, the stacked gate structure GS includes a floating gate FG and a control gate CG stacked on the floating gate FG. According to an embodiment of the present invention, the floating gate FG protrudes from the bottom of the control gate CG in the reference x-axis direction. According to an embodiment of the present invention, an insulating layer IN3, for example, an oxide-nitride-oxide (ONO) layer is disposed between the floating gate FG and the control gate CG.

According to an embodiment of the present invention, an insulating layer IN4, such as a silicon oxide layer, is disposed between the first gate G1 and the substrate 100, and an insulating layer IN5, such as a silicon oxide layer, is disposed between the floating gate FG and the substrate 100, and an insulating layer IN6, for example, a silicon oxide layer, is disposed between the second gate G2 and the substrate 100. According to an embodiment of the present invention, the thickness of the insulating layer IN6 may be greater than or equal to the thickness of the insulating layer IN4 and the insulating layer IN5.

Figure 3:
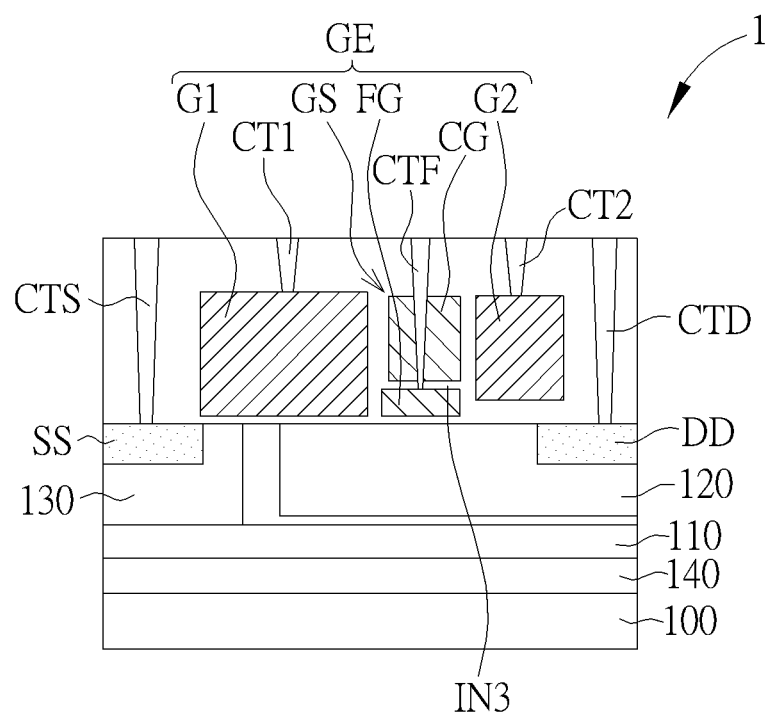
FIG. 3 is a schematic cross-sectional view of a power device according to another embodiment of the present invention.

FIG. 3 is a schematic cross-sectional view of a power device according to another embodiment of the present invention, wherein like parts, regions or layers are still designated by like numeral numbers or labels. As shown in FIG. 3, the power device 1 includes a substrate 100 of a first conductivity type, an ion well 110 of the first conductivity type located in the substrate 100, a base region 130 of the first conductivity type located in the ion well 110, a source doped region SS of a second conductivity type located in the body region 130, and a drain doped region DD of the second conductivity type located in the ion well 110.

According to an embodiment of the present invention, the first conductivity type may be P type, and the second conductivity type may be N type. According to an embodiment of the present invention, the substrate 100 may be, for example, a silicon substrate or other semiconductor substrates. According to an embodiment of the present invention, the ion well 110 of the first conductivity type may be a deep P well. According to an embodiment of the present invention, the power device 1 may further include a deep N-type well 140 in the substrate 100 under the ion well 110 of the first conductivity type.

According to an embodiment of the present invention, the power device 1 may further include a drift region 120 having the second conductivity type, located in the ion well 110. The drift region 120 is spaced apart from the body region 130. According to another embodiment of the present invention, the drift region 120 having the second conductivity may be omitted.

According to an embodiment of the present invention, gates GE are disposed on the substrate 100 between the source doping region SS and the drain doping region DD. The gates GE extend parallel to each other along a first direction. According to an embodiment of the present invention, the gates GE are, for example, polysilicon gates. According to an embodiment of the present invention, the gates GE includes a first gate G1 adjacent to the source doped region SS, a second gate G2 adjacent to the drain doped region DD, and a stacked gate structure GS between the first gate G1 and the second gate G2. According to an embodiment of the present invention, the first gate G1 is located between the body region 130 and the drift region 120.

According to an embodiment of the present invention, the stacked gate structure GS is insulated from the first gate G1 and the second gate G2. According to an embodiment of the present invention, the stacked gate structure GS includes a floating gate FG and a control gate CG stacked on the floating gate FG. According to an embodiment of the present invention, the floating gate FG protrudes in a second direction from the bottom of the control gate CG. According to an embodiment of the present invention, an insulating layer IN3, for example, an oxide-nitride-oxide (ONO) layer is disposed between the floating gate FG and the control gate CG.

According to an embodiment of the present invention, the power device 1 may further include a first gate contact CT1, which is electrically connected to the first gate G1, a second gate contact CT2, which is electrically connected to the second gate G2, and a floating gate contact CTF, which is electrically connected to the floating gate FG, a source contact CTS, which is electrically connected to the source doped region SS, and a drain contact CTD, which is electrically connected to the drain doped region DD. For example, during operation, 5 V can be supplied to the first gate G1 through the first gate contact CT1, 0 V can be supplied to the second gate G2 through the second gate contact CT2, and 5 V can be supplied to the floating gate FG through the floating gate contact CTF. The voltages supplied to the floating gate FG can be adjusted depending on the design requirements.

Figure 4:
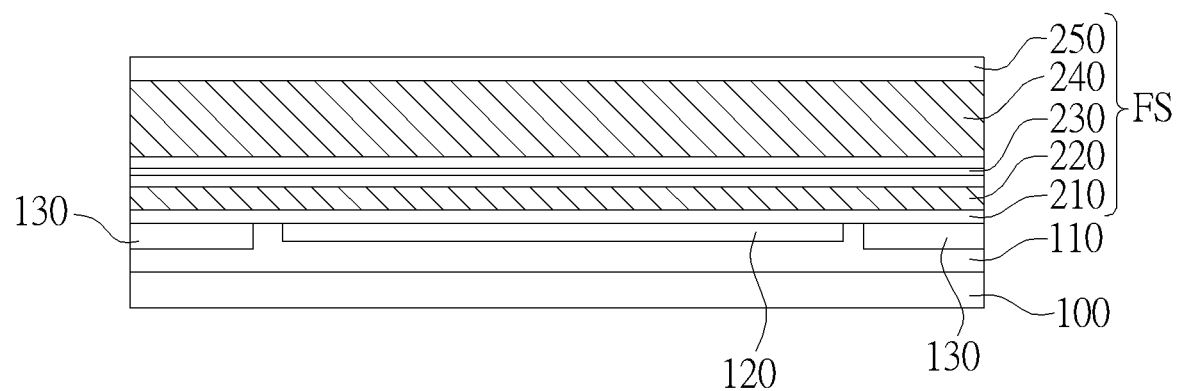
FIG. 4 to FIG. 8 are schematic diagrams illustrating a method for fabricating a power device according to an embodiment of the present invention.

Please refer to FIG. 4 to FIG. 8, which are schematic diagrams of a manufacturing method of a power device according to an embodiment of the present invention, wherein like parts, regions or layers are still designated by like numeral numbers or labels. The manufacturing method of the power device of the present invention can be compatible with the third-generation embedded superflash (ESF3) memory. As shown in FIG. 4, a substrate 100 of the first conductivity type is first provided. According to an embodiment of the present invention, the substrate 100 may be, for example, a silicon substrate or other semiconductor substrates. The substrate 100 may include an ion well 110 of a first conductivity type and a base region 130 of the first conductivity type.

According to an embodiment of the present invention, the ion well 110 of the first conductivity type may be a deep P-type well. According to an embodiment of the present invention, a deep N-type well may be further formed in the substrate 100 under the ion well 110 of the first conductivity type. According to an embodiment of the present invention, a drift region 120 having the second conductivity may be further formed in the ion well 110. The drift region 120 is spaced apart from the body region 130. According to another embodiment of the present invention, the drift region 120 having the second conductivity may be omitted. According to the embodiment of the present invention, the first conductivity type may be P type, and the second conductivity type may be N type.

According to an embodiment of the present invention, next, a stack structure FS is formed on the substrate 100. The stack structure FS may include an insulating layer 210, a polysilicon layer 220, an insulating layer 230, a polysilicon layer 240, and a hard mask layer 250. According to an embodiment of the present invention, for example, the insulating layer 210 may be a silicon oxide layer, and the insulating layer 230 may be an oxide-nitride-oxide (ONO) layer. According to an embodiment of the present invention, for example, the hard mask layer 250 may be a silicon nitride layer.

Figure 5:
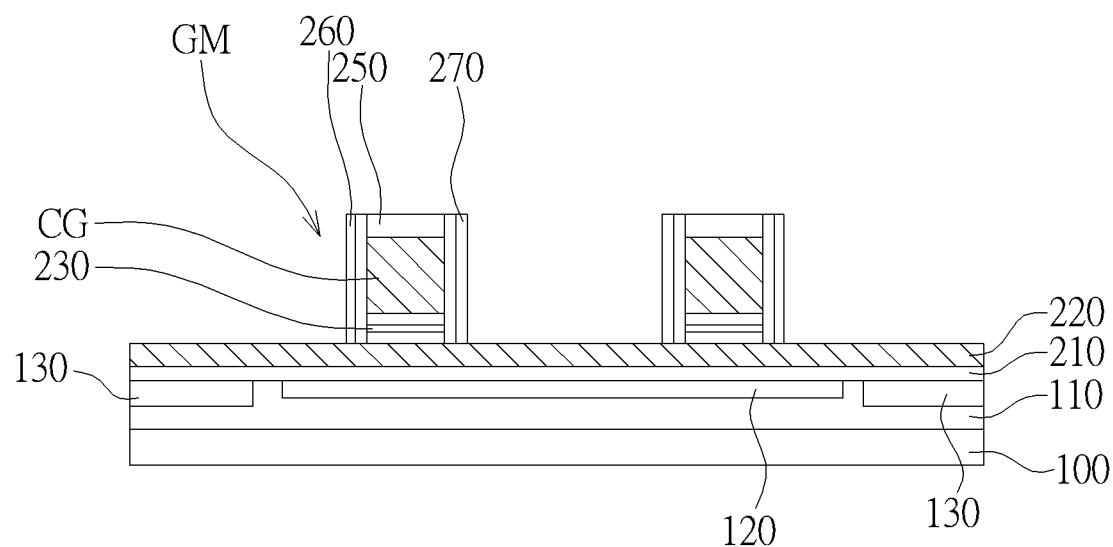

As shown in FIG. 5, next, the insulating layer 230, the polysilicon layer 240 and the hard mask layer 250 in the stacked structure FS are patterned by using a lithography process and an etching process to form an intermediate structure GM. Then, spacers 260 and 270 are formed on the sidewalls of the intermediate structure GM. According to an embodiment of the present invention, the spacers 260 and 270 may include silicon oxide, silicon nitride, or the like.

Figure 6:
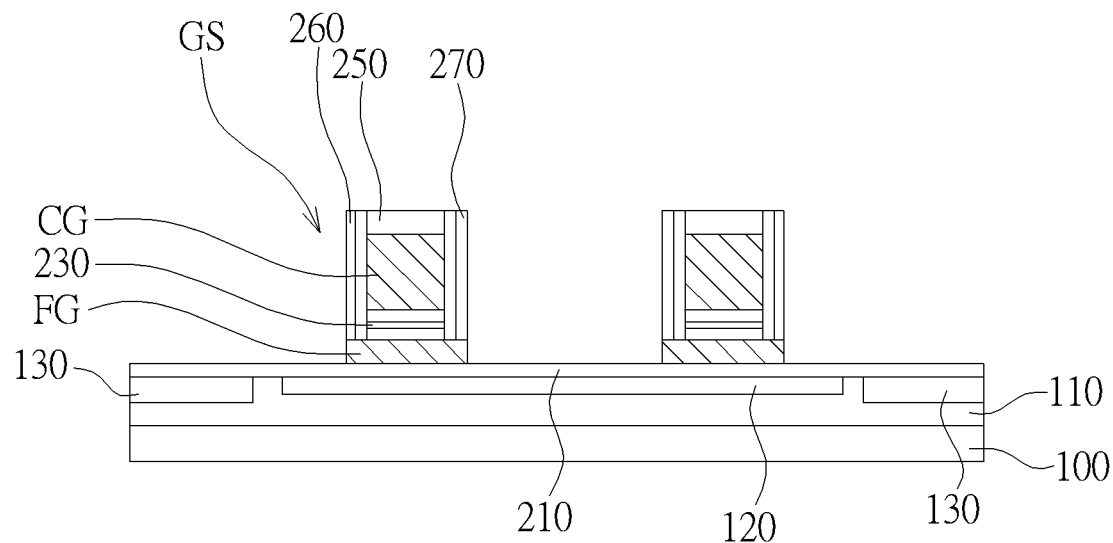

As shown in FIG. 6, after the spacers 260 and 270 are formed, the anisotropic etching process is performed, and the polysilicon layer 220 is etched in a self-aligned manner, thereby forming the stacked gate structure GS, including the floating gate FG and the control gate CG stacked on the floating gate FG. According to an embodiment of the present invention, the floating gate FG slightly protrudes from the bottom of the control gate CG.

Figure 7:
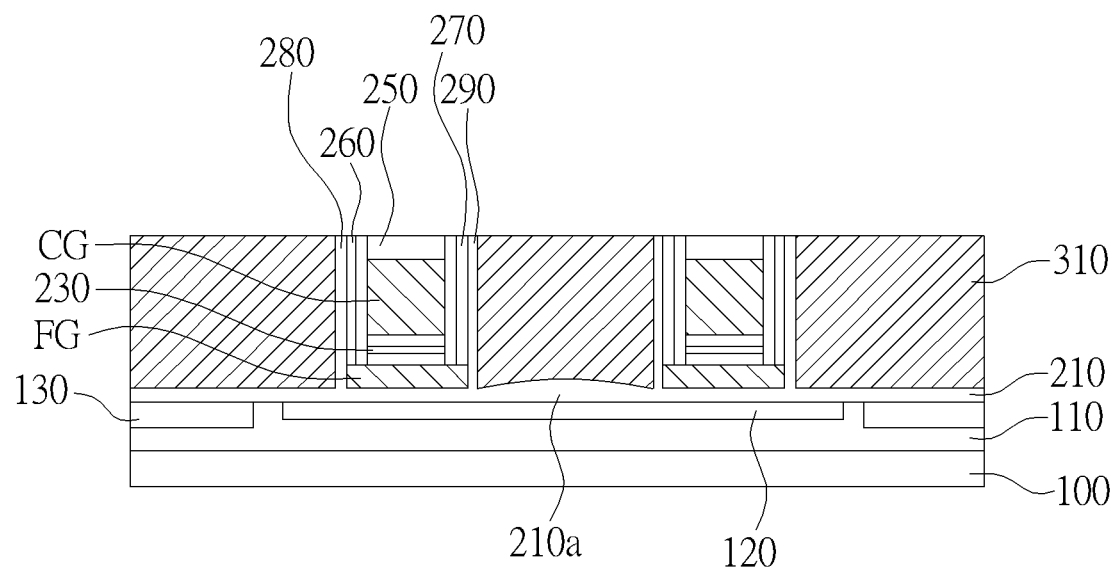

As shown in FIG. 7, next, spacers 280 and 290 are formed on the sidewalls of the stacked gate structure GS. Subsequently, the thickness of the insulating layer 210 on the drain doped region DD may be selectively increased, for example, by thermal oxidation to form a thickened insulating layer 210a. A polysilicon layer 310 is then deposited in a blanket manner, which fills the space between the stacked gate structures GS. The polysilicon layer 310 is then planarized by a chemical mechanical polishing (CMP) process.

Figure 8:
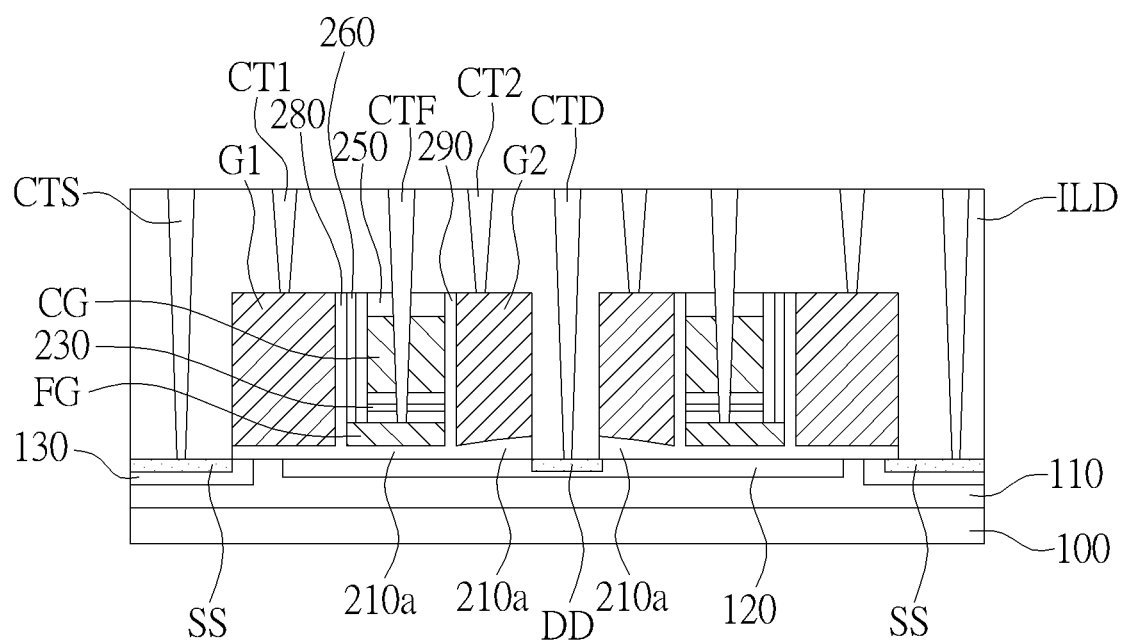

As shown in FIG. 8, next, a lithography process and an etching process are performed to pattern the polysilicon layer 310 thereby forming a first gate electrode G1 and a second gate electrode G2. An ion implantation process is then performed to form a source doped region SS of the second conductivity and a drain doped region DD of the second conductivity in the substrate 100. According to an embodiment of the present invention, the source doped region SS is located in the body region 130, and the drain doped region DD is located in the ion well 110.

Subsequently, a dielectric layer ILD is deposited on the substrate 100. A first gate contact CT1, which is electrically connected to the first gate G1, a second gate contact CT2, which is electrically connected to the second gate G2, and a floating gate contact CTF, which is electrically connected to the floating gate FG, a source contact CTS, which is electrically connected to the source doped region SS, and a drain contact CTD, which is electrically connected to the drain doped region DD, are formed in the dielectric layer ILD.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power device, comprising:
   a substrate of a first conductivity type;
   an ion well of the first conductivity type in the substrate;
   a body region of the first conductivity type in the ion well;
   a source doped region of the second conductivity in the body region;
   a drain doped region of the second conductivity in the ion well;
   a plurality of gates disposed on the substrate between the source doped region and the drain doped region, wherein the plurality of gates extends in parallel with one another along a first direction, and wherein the plurality of gates comprises a first gate adjacent to the source doped region, a second gate adjacent to the drain doped region, and a stack gate structure between the first gate and the second gate, wherein the stack gate structure comprises a floating gate and a control gate stacked on the floating gate, and wherein the floating gate protrudes from a bottom of the control gate in a second direction; and
   a drift region of a second conductivity in the ion well, wherein the drift region is spaced apart from the body region, and wherein the first gate is located between the body region and the drift region.

2. The power device according to claim 1, wherein the first conductivity type is P type and the second conductivity type is N type.

3. The power device according to claim 1, wherein the ion well of the first conductivity type is a deep P well.

4. The power device according to claim 3 further comprising:
   a deep N well under the deep P well in the substrate.

5. The power device according to claim 1, wherein the stack gate structure is insulated from the first gate and the second gate.

6. The power device according to claim 1, wherein an oxide-nitride-oxide (ONO) layer is disposed between the floating gate and the control gate.

7. The power device according to claim 1, wherein the plurality of gates comprises polysilicon gates.

8. The power device according to claim 1 further comprising:
   a first gate contact electrically connected to the first gate;
   a second gate contact electrically connected to the second gate;
   a floating gate contact electrically connected to the floating gate;
   a source contact electrically connected to the source doped region; and
   a drain contact electrically connected to the drain doped region.

9. A method for forming a power device, comprising:
   providing a substrate of a first conductivity type;
   forming an ion well of the first conductivity type in the substrate;
   forming a body region of the first conductivity type in the ion well;
   forming a drift region of a second conductivity in the ion well, wherein the drift region is spaced apart from the body region;
   forming a source doped region of the second conductivity in the body region;
   forming a drain doped region of the second conductivity in the ion well; and
   forming a plurality of gates on the substrate between the source doped region and the drain doped region, wherein the plurality of gates extends in parallel with one another along a first direction, and wherein the plurality of gates comprises a first gate adjacent to the source doped region, a second gate adjacent to the drain doped region, and a stack gate structure between the first gate and the second gate, wherein the stack gate structure comprises a floating gate and a control gate stacked on the floating gate, and wherein the floating gate protrudes from a bottom of the control gate in a second direction.

10. The method according to claim 9, wherein the first conductivity type is P type and the second conductivity type is N type.

11. The method according to claim 9, wherein the ion well of the first conductivity type is a deep P well.

12. The method according to claim 11 further comprising:
    forming a deep N well in the substrate under the deep P well.

13. The method according to claim 9, wherein the stack gate structure is insulated from the first gate and the second gate.

14. The method according to claim 9, wherein an oxide-nitride-oxide (ONO) layer is disposed between the floating gate and the control gate.

15. The method according to claim 9, wherein the plurality of gates comprises polysilicon gates.

16. The method according to claim 9 further comprising:
    forming a first gate contact electrically connected to the first gate;
    forming a second gate contact electrically connected to the second gate;
    forming a floating gate contact electrically connected to the floating gate;
    forming a source contact electrically connected to the source doped region; and
    forming a drain contact electrically connected to the drain doped region.

17. A layout structure of a power device, comprising:
    a substrate;
    a diffusion region in the substrate surrounded by a trench isolation region;
    a source doped region and a drain doped region in the diffusion region;
    a plurality of gates disposed on the substrate between the source doped region and the drain doped region, wherein the plurality of gates extends in parallel with one another and traverses across the diffusion region, and wherein the plurality of gates comprises a first gate adjacent to the source doped region, a second gate adjacent to the drain doped region, and a stack gate structure between the first gate and the second gate, wherein the stack gate structure comprises a floating gate and a control gate stacked on the floating gate, and wherein the floating gate protrudes from a bottom of the control gate in a second direction; and a drift region of a second conductivity in the ion well, wherein the drift region is spaced apart from the body region, and wherein the first gate is located between the body region and the drift region.

* * * * *